United States Patent
Lee et al.

(10) Patent No.: US 9,437,495 B2
(45) Date of Patent: Sep. 6, 2016

(54) MASK-LESS DUAL SILICIDE PROCESS

(71) Applicant: Taiwan Semiconductor Manufacturing Company, Ltd., Hsin-Chu (TW)

(72) Inventors: Chen-Ming Lee, Yangmei (TW); Fu-Kai Yang, Hsin-Chu (TW); Hsien-Cheng Wang, Hsin-Chu (TW); Mei-Yun Wang, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 4 days.

(21) Appl. No.: 14/542,264

(22) Filed: Nov. 14, 2014

(65) Prior Publication Data
US 2016/0141384 A1 May 19, 2016

(51) Int. Cl.
*H01L 21/8234* (2006.01)
*H01L 29/66* (2006.01)
*H01L 29/78* (2006.01)

(52) U.S. Cl.
CPC ........ *H01L 21/823418* (2013.01); *H01L 21/823437* (2013.01); *H01L 21/823468* (2013.01); *H01L 21/823475* (2013.01); *H01L 29/665* (2013.01); *H01L 29/66545* (2013.01); *H01L 29/7848* (2013.01)

(58) Field of Classification Search
None
See application file for complete search history.

(56) References Cited

U.S. PATENT DOCUMENTS

| 2009/0001413 A1* | 1/2009 | Gauthier, Jr. ... H01L 21/823807 257/190 |
| 2014/0225198 A1* | 8/2014 | Suk ............... H01L 21/823871 257/369 |

* cited by examiner

Primary Examiner — Anthony Ho
Assistant Examiner — Kevin Quinto
(74) Attorney, Agent, or Firm — Slater Matsil, LLP

(57) ABSTRACT

A method of forming a semiconductor device is provided. The method includes forming a mask layer, such as an oxidized layer, over first source/drain regions in a first device region. A dielectric layer, such as an interlayer dielectric layer, is formed and patterned to expose the first source/drain regions and second source/drain regions in a second device region. A silicide treatment is performed on the second source/drain regions while the mask layer protects the first source/drain regions. The mask layer is then removed and a silicide treatment is performed on the first source/drain regions.

20 Claims, 10 Drawing Sheets

MASK-LESS DUAL SILICIDE PROCESS

BACKGROUND

Size reduction of metal-oxide-semiconductor field-effect transistors (MOSFETs) and FinFETs, including reduction of the gate length and gate oxide thickness, has enabled the continued improvement in speed, performance, density, and cost per unit function of integrated circuits over the past few decades. To further enhance transistor performance, MOSFET devices have been fabricated using strained channel regions located in portions of a semiconductor substrate. Strained channel regions allow enhanced carrier mobility to be realized, thereby resulting in increased performance when used for n-channel (NMOSFET) or for p-channel (PMOSFET) devices. Generally, it is desirable to induce a tensile strain in the n-channel of an NMOSFET transistor in the source-to-drain direction to increase electron mobility and to induce a compressive strain in the p-channel of a PMOSFET transistor in the source-to-drain direction to increase hole mobility. There are several existing approaches of introducing strain in the transistor channel region.

In one approach, strain in the channel region is introduced by creating a recess in the substrate in the source/drain regions. For example, a PMOS device having a compressive stress in the channel region may be formed on a silicon substrate by epitaxially growing a stress-inducing layer having a larger lattice structure than the silicon, such as a layer of SiGe, within recessed regions in the source/drain regions. Similarly, an NMOS device having a tensile stress in the channel region may be formed on a silicon substrate by epitaxially growing a stress-inducing layer having a smaller lattice structure than the silicon, such as a layer of SiP, within recessed regions in the source/drain regions.

Contact resistance may also be reduced. In one approach, a metal layer is formed over the source and drain regions. An anneal process is performed to cause a metal silicide to be formed, and un-reacted materials from the metal layer is removed. The silicide layer allows a lower contact resistance between subsequently formed contacts and the source and drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
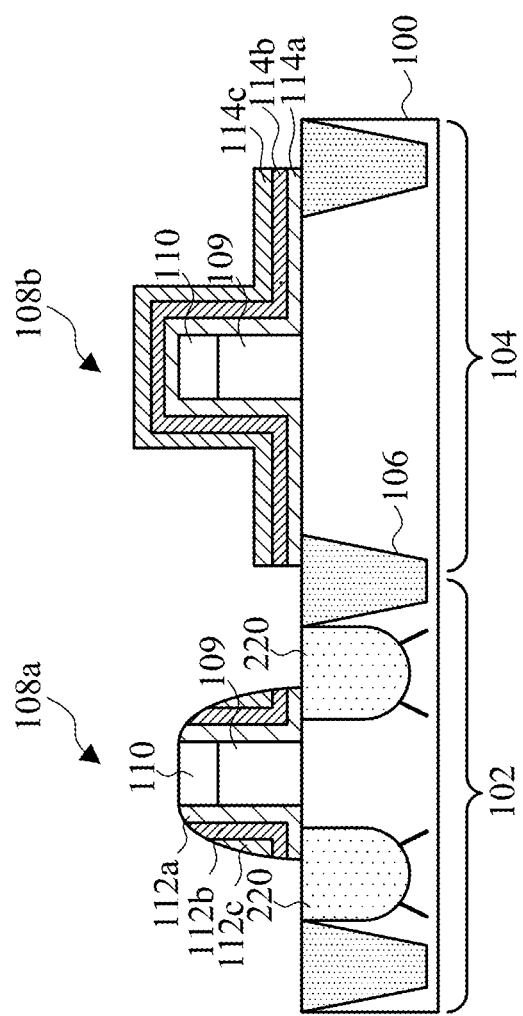
FIGS. 1-9 illustrate cross-sectional views of various intermediate process steps of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As will be discussed in greater detail below, a semiconductor structure and a method of forming a semiconductor structure will be discussed. The process advantageously does not require individual mask layers. Rather, the process described below utilizes a self-aligned process to form masks (e.g., oxidized masks) over first source/drain regions to protect the first source/drain regions while processing the second source/drain regions.

The embodiments discussed below are illustrated as a planar transistor or a FinFET transistor and as having a particular spacer structure. Other embodiments, however, may use any suitable structure, such as different spacer structures, different doping profiles, different gate structures, and/or the like.

FIGS. 1-9 illustrate various cross-section views of a portion of a substrate 100 during various stages of fabrication of a semiconductor device in accordance with some embodiments. Referring first to FIG. 1, there is shown the substrate 100 having a first device region 102 and a second device region 104. In the illustrated embodiment, the first device region 102 is electrically isolated from the second device region by a shallow trench isolation (STI) region 106. The substrate 100 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 100 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; other Group III-V materials; or combinations thereof. Other substrates, such as multi-layered or gradient substrates, may also be used. As will be explained in greater detail below, the first device region 102 will be utilized to form a semiconductor device having a first conductivity type, such as an NMOS device, and the second device region 104 will be utilized to form a semiconductor device having a second conductivity type, such as a PMOS device.

Also shown in FIG. 1 are a first dummy gate stack 108a and a second dummy gate stack 108b (collectively referred to as "dummy gate stacks 108) formed on the substrate 100. As discussed in greater detail below, the dummy gate stacks 108 are sacrificial structures used to align and form source/drain regions (not individually shown) adjacent to the dummy gate stacks 108 and will be replaced in subsequent processing steps. As such, the dummy gate stacks 108 may be formed of any suitable material and processes. In some embodiments, the dummy gate stacks 108 are formed simultaneously as other devices on the wafer, such as other transistors. In these embodiments, it may be desirable to form the dummy gate stacks 108 from materials used to form functional gate stacks for other devices. In some embodiments, the dummy gate stacks 108 include a polysilicon layer 109 and a hardmask 110. The dummy gate stacks may be formed by depositing a polysilicon layer and a hardmask layer and patterning the polysilicon layer and a hardmask layer using photolithography techniques, thereby forming the dummy gate stacks 108 as illustrated in FIG. 1.

The source/drain regions may include any appropriate doping profile for a particular application. For example, the source/drain regions may include lightly-doped source/drain (LDD) regions formed by implanting dopants, e.g., n-type dopants or p-type dopants, using the dummy gate stacks 108 as a mask, thereby aligning the LDD regions with the edges of dummy gate stacks 108. Halo and/or pocket regions (not shown) may also be formed.

FIG. 1 further illustrates the formation of one or more first spacers 112 formed alongside the first dummy gate stack 108a and one or more first spacer layers 114 formed over the second device region 104 in accordance with some embodiments. FIG. 1 illustrates an embodiment in which the first spacers 112 include first spacers 112a-112c (collectively referred to as "first spacers 112") along sidewalls of the first dummy gate stack 108a, and in which the first spacer layers 114 include first spacer layers 114a-114c (collectively referred to as "first spacer layers 114").

In some embodiments, the first spacers 112a may be utilized to position the source/drain regions (e.g., the LDD regions) relative to the dummy gate stacks 108. For example, in some embodiments, the first spacer layer 114a is formed over the first device region 102 and the second device region 104. LDD regions may be formed in the first device region 102 and the second device region 104 by forming patterned masks, such as a photoresist mask, to protect the first device region 102 while implanting the second device region 104 and to protect the second device region 104 while implanting the first device region 102.

Thereafter, the first spacer layers 114b and 114c may be formed over the first device region 102 and the second device region 104. FIG. 1 illustrates an embodiment in which the first spacer layers 114a-114c are patterned in the first device region 102 to form the first spacers 112a-112c, respectively, in preparation for subsequent processing, such as recessing the substrate to form an epitaxial source/drain regions. Generally, the first spacers 112 are formed by depositing conformal layers, such as the first spacer layers 114 and performing an anisotropic etch in the first device region 102 while the first spacer layers 114 are masked (not shown) in the second device region 104. Because a thickness of the spacer layers are thicker alongside the first dummy gate stack 108a, the anisotropic etch removes the material of the first spacer layers 114 from the horizontal surfaces, thereby forming the first spacers 112 as illustrated in FIG. 1.

As will be discussed below, the materials used to form the first spacer layer 114a, the first spacer layer 114b, and the first spacer layer 114c (and hence the first spacers 114a-c, respectively) are selected to allow for the selective removal of the various layers, such as using materials having different etch rates compared to the adjoining materials. For example, in some embodiments, the first spacer 112a and the first spacer layer 114a are formed of SiCN, the first spacer 112b and the first spacer layer 114b are formed of SiCN, and the first spacer 112c and the first spacer layer 114c are formed of SiN. Using materials such as these will allow the selective removal of an overlying layer as discussed in greater detail below.

FIG. 1 also illustrates formation of first device stress regions 220 formed in the substrate 100 along opposing sides of the first dummy gate stack 108a. In some embodiments, the first device stress regions 220 are formed by recessing the substrate 100 and subsequently epitaxially growing a material having a different lattice constant in the recesses. Generally, the difference in the lattice constant causes a strain to be applied to the substrate in the channel region below the gate stack, wherein a compressive stress may enhance the performance of a PMOS device and a tensile stress in the channel region may enhance the performance of an NMOS device. Accordingly, in the case in which the first device region is an NMOS device region, a material having a smaller lattice structure, such as SiP, SiC:P (SiC with P dopants), or the like, is formed to create a tensile stress in the channel region, thereby enhancing the performance of the NMOS device.

In some embodiments, the etch process to form the recess may be performed, for example, by a dry chemical etch with a plasma source and an etchant gas. The plasma source may be an inductively coupled plasma (ICR) etch, a transformer coupled plasma (TCP) etch, an electron cyclotron resonance (ECR) etch, a reactive ion etch (RIE), or the like and the etchant gas may be fluorine, chlorine, bromine, combinations thereof, or the like. In another embodiment, the recess may be formed by a wet chemical etch, such as ammonium peroxide mixture (APM), $NH_4OH$, TMAH, combinations thereof, or the like. In yet other embodiments, the recess may be formed by a combination of a dry chemical etch and a wet chemical etch. As illustrated in FIG. 1, the second device region 104 is protected by the first spacer layers 114 during this etch process. In some embodiments, additional masking layers (not shown), such as a photoresist or other mask(s), may be formed over the first spacer layers 114 to provide additional protection during the etch process.

In embodiments such as that illustrated in FIG. 1, the substrate 100 is recessed after forming the first spacers 112a-c and first spacer layers 114a-c. In some embodiments, the recess process may undercut one or more of the first spacers 112, such as that illustrated in FIG. 1. The distance between an edge of the recess and the edge of the first dummy gate 108a may be adjusted by controlling the thickness of the first spacers 112a-c and the etch processes to provide a desirable configuration for a particular application.

The first device stress regions 220 may be formed using, for example, a CVD process. For example, in embodiments in which the first device stress regions 220 are formed of a SiP, a CVD process may be performed using process gases of dicholorosilane ($Cl_2H_2Si$) at a flow rate of about 700 sccm to about 1000 sccm, $SiH_4$ at a flow rate of about 10 to about 50 sccm, HCl at a flow rate of about 300 to about 600 sccm, and $PH_3$ at a flow rate of about 200 to about 500 sccm, with carrier gases of $H_2/N_2$ at a flow rate of about 2000 sccm to about 5000 sccm. The process may be performed at a temperature of about 670° C. to about 700° C., and a pressure of about 200 torr to about 400 torr. FIG. 1 illustrates an upper surface of the first stress regions 220 being co-planar with an upper surface of the substrate 100 for illustrative purposes. In other embodiments, the first stress regions 220 may be raised or recessed relative to the upper surface of the substrate 100. For example, in some embodiments, the first device stress regions 220 are raised such that enough to prevent or limit a subsequent hard mask (e.g., first device stress region masks 422) from extending under a fin top. Further, the first device stress regions 220 lateral growth may be controlled to prevent or limit other issues, such as SRAM N/P EPI merge issue.

The structure provided above is for illustrative purposes only and other embodiments may utilize other structures, materials, and features. For example, some embodiments may incorporate buried stressors, recessed source/drain regions filled with a stressor, raised source/drain regions, different materials, different gate structure and materials, halo implants, different source/drain doping profiles, and the like.

Figure 2:
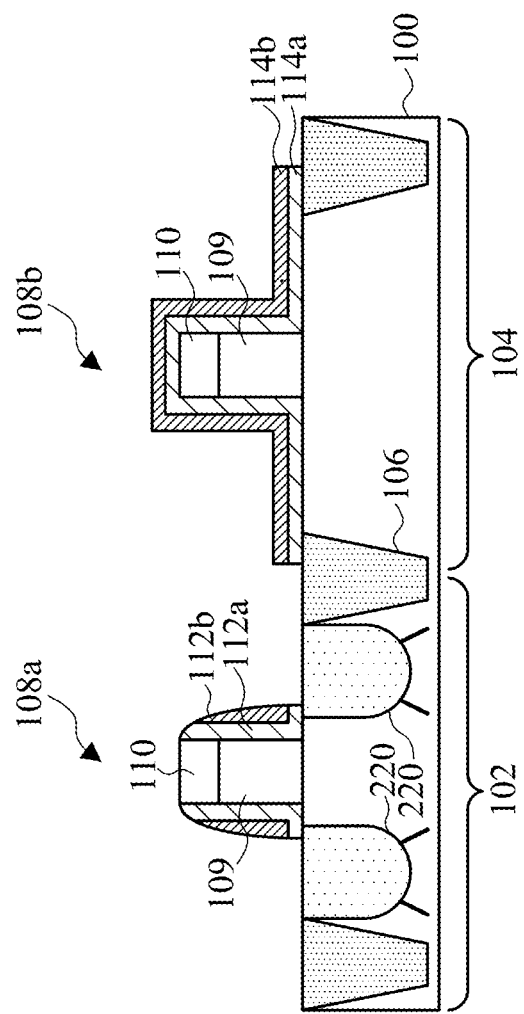

FIG. 2 illustrates removal of the uppermost first spacer 112c and the uppermost first spacer layer 114c from the first device region 102 and the second device region 104, respectively. In some embodiments in which the first spacer 112c and the first spacer layer 114c are formed of a silicon nitride, the first spacer 112c and the first spacer layer 114c may be removed using, for example, phosphoric acid at a temperature in the range of 100° C. to 180° C. using an etch time of about 30 to 2,000 seconds. Other etch processes may be utilized to maintain a sufficient etch selectivity between the material of the first spacer 112c and the first spacer layer 114c and the material of the other features present, such as the material of the first spacer 112b, the first spacer layer 114b, and the first stress regions 220.

Figure 3:
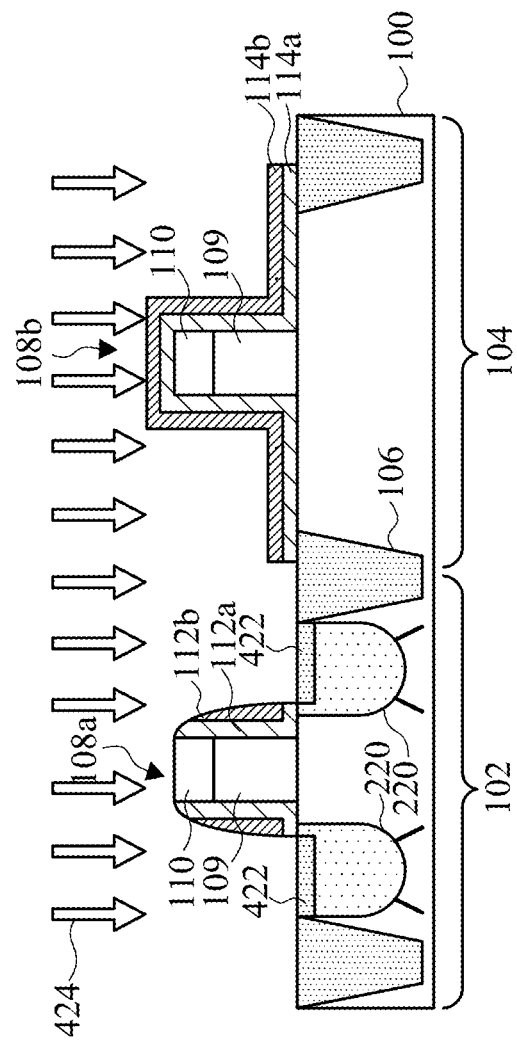

Referring now to FIG. 3, there is shown first device stress region masks 422 formed over the first device stress regions 220 in accordance with some embodiments. As will be explained in greater detail below, the first device stress region masks 422 will protect the first device stress regions 220 during process steps to form a silicide region in the second device region 104, thereby allowing different silicide regions to be formed in the first device region 102 and the second device region 104.

In some embodiments, the first device stress region masks 422 are formed by an implant (represented by arrows 424). For example, in some embodiments, oxygen is implanted at a dose of about 1E16 atoms/cm$^2$ to about 1E18 atoms/cm$^2$ and at an energy of about 1 keV to about 5 keV to control a thickness of the masks. A subsequent anneal performed at a temperature from about 700° C. to about 1000° C. for a duration of about 30 minutes to about 120 minutes causes the oxygen and the silicon to form a SiO$_2$ hard mask.

Forming the first device stress region masks 422 in a manner such as this provides a self-aligned process to protect a surface of the first device stress regions 220. As discussed in greater detail below, the first device stress region masks 422 protect the first device stress regions 220 during subsequent processes to form a silicide region (e.g., a NiSi) in the second device region 104. The first device stress region masks 422 prevent a silicide region from being formed on the first device stress regions 220 when being formed on the second device region 104.

A thickness of the first device stress region masks 422 may be adjusted by, for example, adjusting the oxygen implant energy and/or dose to prevent or reduce the silicide formation on the first device stress regions 220 during processing of the second device region 104. In some embodiments, the first device stress region masks 422 have a thickness of about 10 nm to about 12 nm.

Figure 4:
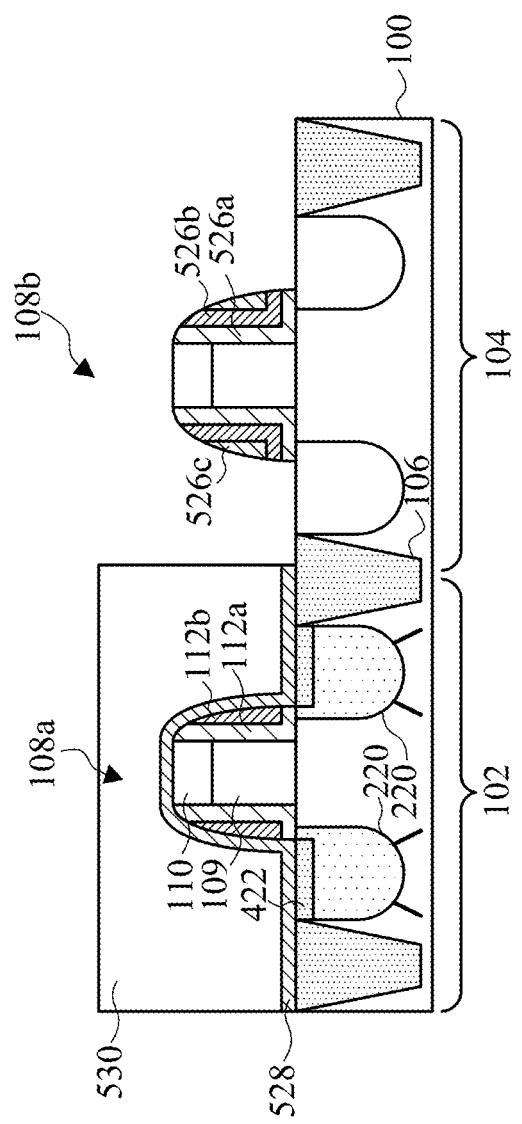

FIG. 4 illustrates recessing of the substrate 100 along opposing sides of the second dummy gate stack 108b in accordance with some embodiments. As will be explained in greater detail below, a semiconductor material having a different lattice constant than the underlying substrate 100 will be formed in the recesses to induce a stress in the channel region below the second dummy gate stack 108b. For example, in embodiments in which the second device region 104 is a PMOS device region, a semiconductor material having a greater lattice structure than the substrate will be formed to induce a compressive stress in the channel region.

The recesses may be formed, for example, by forming second spacers 526 alongside the second dummy gate stack 108b. The second spacers 526 may be formed by depositing a second spacer layer 528 over the substrate 100 in the first device region 102 and over the first spacer layers 114a-b in the second device region 104. The second spacer layer 528 is masked in the first device region by a patterned mask 530. In some embodiments, the patterned mask 530 is a photoresist material patterned using photolithography techniques. The second spacer layer 528 and the first spacer layers 114a-b are patterned in the second device region 104, thereby forming the second spacers 526a-c (collectively referred to as second spacers 526).

The first spacer layers 114a-b and the second spacer layer 528 may be patterned in the second device region 104 using, for example, one or more anisotropic etch processes. For example, in embodiments in which the second spacer layer 528 comprises SiN and the first spacer layers 114a-b comprises SiCN, first spacer layers 114a-b and the second spacer layer 528 may be patterned using phosphoric acid at a temperature in the range of 100° C. to 180° C. using an etch time of about 30 to 2,000 seconds.

Thereafter, the substrate 100 is recessed along opposing sides of the second gate stack. The substrate 100 may be recessed using a similar process as discussed above with reference to forming recesses in the first device region. As illustrated in FIG. 4, in some embodiments the recesses, and hence the subsequent stress material, may undercut the second spacers 526. The amount of undercut, if any, may be controlled by the thickness of the first spacer layers 114 and the second spacer layers 528 and the etch processes.

Figure 5:
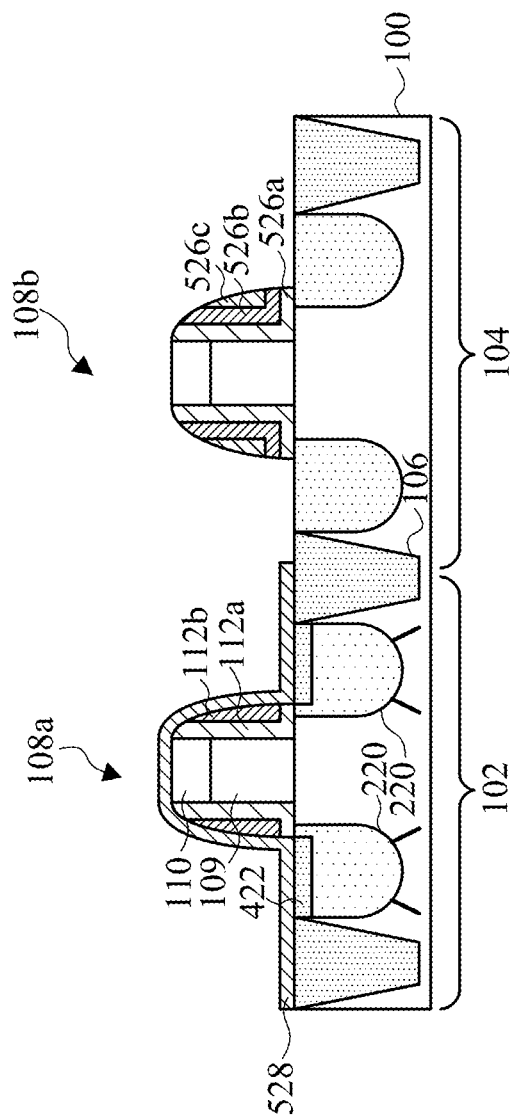

After forming the recesses, the patterned mask 530 may be removed as illustrated in FIG. 5. In embodiments in which the patterned mask 530 is a photoresist mask, the patterned mask 530 may be removed using, for example, a plasma ashing process. For example, the plasma ashing process may utilize an O$_2$ flow rate of about 1000 sccm to about 2000 sccm at a pressure of about 300 mTorr to about 600 mTorr and at power of about 500 Watts to about 2000 Watts and at a temperature of about 80° C. to about 200° C., for example. The plasma ashing process may be followed by a wet dip in a sulfuric acid (H$_2$SO$_4$) solution to clean the wafer and remove remaining photoresist material.

Figure 6:
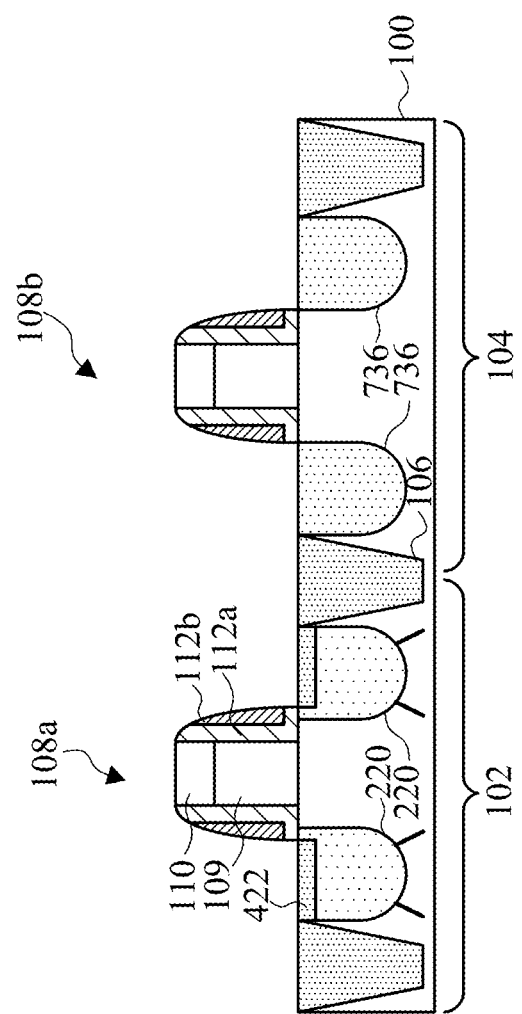

Referring now to FIG. 6, there is shown second stress regions 736 formed in the recesses of in the second device region 104 in accordance with some embodiments. The second stress regions 736 may be epitaxially grown using, for example, a CVD process. For example, in embodiments in which the second device stress regions 736 are formed of a SiGe, a CVD process may be performed using process gases of dicholorosilane (Cl$_2$H$_2$Si) at a flow rate of about 100 sccm to about 500 sccm, GeH$_4$ at a flow rate of about 100 sccm to about 1000 sccm, HCl at a flow rate of about 10 to about 500 sccm, and B$_2$H$_6$ at a flow rate of about 20 to about 300 sccm, with carrier gases of H$_2$/N$_2$ at a flow rate of about 10 slm to about 50 slm. The process may be performed at a temperature of about 500° C. to about 800° C., and a pressure of about 200 torr to about 400 torr. FIG. 6 illustrates an upper surface of the second stress regions 736 being co-planar with an upper surface of the substrate 100 for illustrative purposes. In other embodiments, the second stress regions 736 may be raised or recessed relative to the upper surface of the substrate 100.

In some embodiments, a clean process may be performed prior to the epitaxy process. For example, in some embodiments, a wet etch process, such as a SiCoNi etch process may be performed to remove native oxide formed along a surface of the substrate 100 in the recesses.

Heavily doped source/drain regions (not individually shown) may also be formed in the second device region 104. The source/drain regions may include any suitable doping profile, and may be formed using any suitable process, including any suitable use of spacers, liners, and/or sacrificial liners/spacers. For example, heavily-doped regions may be formed in situ or after formation of the stressed source/drain regions with the use of spacers. As another example, the heavily-doped regions may be formed after forming second stress regions 736 by, for example, implantation, diffusion, or the like. Furthermore, other doped regions, such as wells, halo/pocket implants, and/or the like, may also be used.

Thereafter, the second spacer layer 528 in the first device region 102 and the second spacers 526 in the second device region 104 may be removed. In embodiments in which the second spacer layer 528 and the second spacers 526 are formed of SiN, the second spacer layer 528 and the second spacers 526 may be removed using phosphoric acid.

Figure 7:
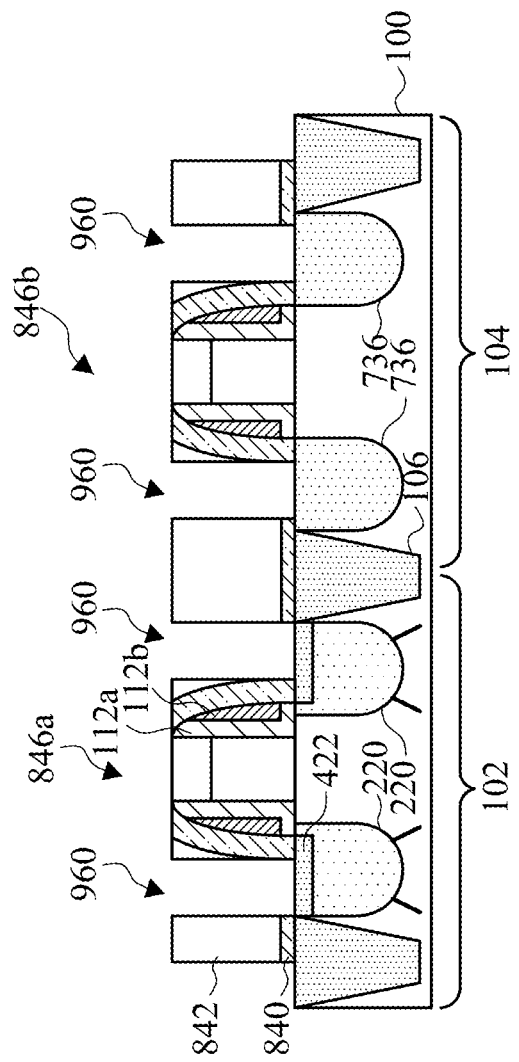

FIG. 7 illustrates formation of a contact etch stop layer (CESL) 840 and an inter-layer dielectric (ILD) 842 in accordance with some embodiments. Generally, the CESL 840 is formed of a different material than the material of the ILD 842, wherein an etch rate of the material of the CESL 840 is lower than an etch rate of the ILD 842. In this manner, an etch process may utilize the CESL 840 to effectively stop the etch process when forming the contact openings 960 in the ILD 842.

In some embodiments, CESL 840 comprises silicon nitride, silicon carbide, or other dielectric materials and the ILD 842 is formed of, for example, a spin-on glass, Phospho-Silicate Glass (PSG), Boro-Silicate Glass (BSG), Boron-Doped Phospho-Silicate Glass (BPSG), Tetraethyl Orthosilicate (TEOS) oxide, TiN, SiOC, other low-k non-porous dielectric materials, other dielectric materials, and/or the like.

In some embodiments, the ILD 842 is formed to a height greater than a height of the first dummy gate stack 108a and the second dummy gate stack 108b. A planarization step, which is performed using, for example, chemical mechanical polish (CMP). The CMP is performed to remove excess portions of ILD 842 and CESL 840 to expose the dummy gate stacks 108.

In embodiments in which a gate-last approach is being used, one or both of the dummy gate stacks may be replaced with, for example, metal gate stacks, such as a first metal gate stack 846a in the first device region 102 and a second metal gate stack 846b in the second device region 104. The first metal gate stack 846a and the second metal gate stack 846b are collectively referred to as the metal gate stacks 846.

For example, in embodiments in which the dummy gate stacks 108 comprise a polysilicon, the dummy gate stacks 108 (see FIG. 1) may be selectively etched using either dry or wet etching. In the case dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. In the case wet etching is used, the chemicals may include $NH_4OH:H_2O_2:H_2O$ (APM), $NH_2OH$, KOH, $HNO_3:NH_4F:H_2O$, and/or the like. In some embodiments, the dummy gate stacks may include a dummy gate dielectric and may also be removed. For example, in embodiments in which the dummy gate stacks 108 include a silicon oxide dummy gate dielectric, the silicon oxide may be removed using a wet etch process using a dilute hydrofluoric acid or a dry etch process.

Thereafter, a first metal gate stack 846a in the first device region 102 and a second metal gate stack 846b in the second device region 104 are formed. While FIG. 7 illustrates the metal gate stacks 846 as a single layer for illustrative purposes, in some embodiments the metal gate stacks 846 comprises one or more layers, such as one or more metal layers and/or other conductive layers. For example, in some embodiments, the metal gate stacks 846 may comprise one or more layers of Ti, Co, W, W alloys, Al, Al alloys, Cu, Cu alloys, and/or the like, wherein the various layers may be of a similar or different material. The formation methods of metal gate stacks 846 include ALD, PVD, CVD, MOCVD, and the like. In some embodiments, the metal gate stacks 846 may include barrier layer, adhesion layers, work-function metal layers, and/or the like.

The metal gate stacks 846 are collectively illustrated and in some embodiments may include various features. For example, in some embodiments an interfacial layer is formed along a surface of the substrate in the openings in accordance with some embodiments. The interfacial layer helps buffer the substrate 100 and a subsequently formed high-k dielectric layer. In some embodiments, the interfacial layer is a chemical silicon oxide, which may result from chemical reactions. For example, a chemical oxide may be formed using deionized water+ozone ($DIO_3$), $NH_4OH+H_2O_2+H_2O$ (APM), or other methods. Other embodiments may utilize a different material or processes for the interfacial layer. In an embodiment, the interfacial layer may have a thickness of about 10 Å to about 30 Å.

A gate dielectric layer may be formed on the interfacial layer. In some embodiments, the gate dielectric layer includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTi_yO_z$, and the like. The formation methods include molecular-beam deposition (MBD), atomic layer deposition (ALD), physical vapor deposition (PVD), and the like. In an embodiment, the gate dielectric layer may have a thickness of about 10 Å to about 50 Å.

The above description is a general description to provide context and an understanding of some embodiments. Other embodiments may include other layers and/or other processes. For example, in some embodiments a work metal function layer may be included. Generally, the work function of the gate electrodes may be adjusted to the band-edge of the silicon; that is, for an NMOS device, adjusting the work function close to the conduction band, and for a PMOS device, adjusting the work function close to the valence band.

The above description and the illustration of the metal gate are provided as examples only. In other embodiments, other layers, such as interfacial layers, multiple gate dielectric layers, multiple gate electrode layers, and/or the like may be utilized. Further, the various layers and components may have various shapes. For example, in some embodiments the dummy gate dielectric layers and/or gate electrode layers may have a "U" shape being formed along sidewalls and bottom of the opening formed by removal of the dummy gate stacks.

FIG. 7 further illustrates contact openings 960 formed through the ILD 842 to expose the source/drain regions in the first device region 102 and the second device region 104 in accordance with some embodiments. The contact openings 960 may be formed using photolithography techniques. For example, a photoresist material (and a hard mask if necessary) may be formed and patterned over the ILD 842. In embodiments in which the ILD 842 is formed of silicon oxide and the CESL 840 is formed of silicon nitride, the ILD 842 and the CESL 840 may be patterned using a dry etch process.

In some embodiments, a thickness of the first device stress region masks 422 may be reduced during processing. For example, prior to the formation of silicide regions in the second device region 104 as described below, a thickness of the first device stress region masks 422 may be reduced to about 4 nm to about 5 nm.

Figure 8:
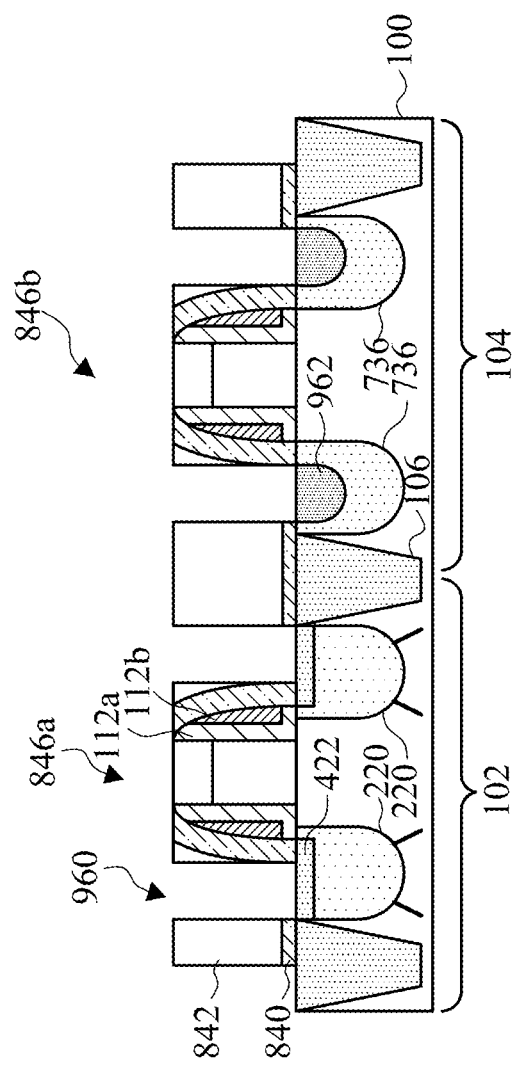

FIG. 8 illustrates formation of a second silicide region 962 over the second device stress regions 736. The first device stress regions 220 are protected during this process by the first device stress region masks 422. In some embodiments, the second silicide regions 962 are formed using a multi-step process. For example, in some embodiments, a pre-amorphization implant (PAI) is performed to control the formation range of the subsequent silicide and reduce the silicide piping defects. The PAI may be performed using, for example, a Ge PAI performed using an implant energy of about 5 keV to about 10 keV and an implant dose of about 1E15 atoms/cm$^2$ to about 5E15 atoms/cm$^2$. A clean process, such as a SiCoNi dry etch process, may be performed to remove native oxide. In some embodiments, about 30 Å to about 50 Å is removed during the clean process.

The second silicide regions 962 may be formed by forming a metallic layer over the surface of the second device stress regions 736 and annealing. In some embodiments, a nickel layer is deposited to a thickness from about 150 Å to about 200 Å. The nickel layer acts as a reacting source for formation of the silicide layer. In some embodiments, a barrier layer may be formed over the nickel (or other type of material) layer to prevent oxidation. For example, a titanium barrier layer having a thickness of about 150 Å to about 200 Å may be used as a barrier layer. Other materials may be used.

Thereafter, a first anneal, such as a rapid thermal anneal (RTA), may be performed, for example, at a temperature of about 250° C. to about 300° C. for about 10 seconds to about 30 seconds may be performed to control the metal-rich phase of Ni$_2$Si thickness. The un-reacted nickel and titanium may be removed using a selective etch process, such as a high-temperature SPM (H$_2$SO$_4$+H$_2$O$_2$), is used at a temperature range of about 150° C. to about 200° C. for about 30 seconds to about 60 seconds. A second anneal, such as a laser anneal, performed, for example, at a temperature of about 800° C. to about 850° C. for about 0.25 ms to about 0.5 ms may be performed to transition the Ni$_2$Si into the NiSi phase. In some embodiments, a thickness of the second silicide regions 962 is about 13 nm to about 17 nm.

Figure 9:
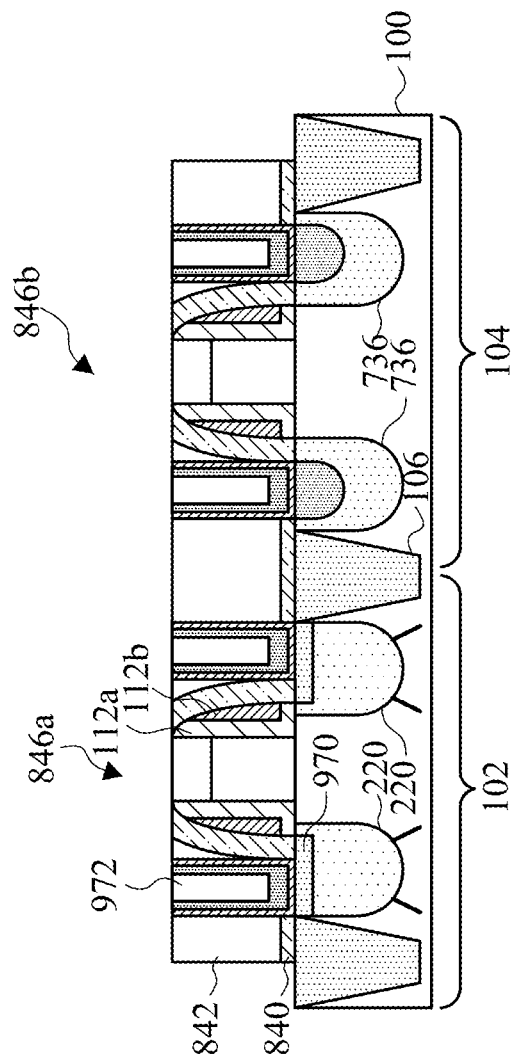

FIG. 9 illustrates formation of the first silicide regions 970 in the first device region 102 in accordance with some embodiments. In some embodiments, the first silicide regions 970 are formed using a multi-step process. For example, in some embodiments, a PAI is performed to reduce the n-type contact resistance. The PAI may be performed using, for example, a Ge PAI performed using an implant energy of about 5 keV to about 15 keV and an implant dose of about 1E13 atoms/cm$^2$ to about 1E14 atoms/cm$^2$. A clean process, such as a SiCoNi dry etch process, may be performed to remove the first device stress region masks 422 in preparation to forming a silicide region. In some embodiments, about 30 Å to about 50 Å is removed during the clean process.

The first silicide regions 970 may be formed by forming a metallic layer over the surface of the first device stress regions 220 and annealing. In some embodiments, a titanium layer is deposited to a thickness from about 80 Å to about 120 Å. The titanium layer acts as a reacting source for formation of the silicide layer. In some embodiments, a barrier layer may be formed over the titanium (or other type of material) layer to prevent oxidation. For example, a titanium nitride barrier layer having a thickness of about 30 Å to about 40 Å may be used as a barrier layer. Other materials may be used.

Thereafter, a third anneal, such as a RTA, may be performed, for example, at a temperature of about 500° C. to about 600° C. for about 0.1 seconds to about 30 seconds may be performed to cause the titanium and the silicon to react, thereby forming a TiSi$_x$ silicide layer. This anneal may also repair some of the damage done to the second silicide regions 962 caused by the PAI. In some embodiments, a thickness of the first silicide regions 970 is about 4 nm to about 6 nm.

Contacts 972 may be formed of any suitable conductive material, such as a highly-conductive, low-resistive metal, elemental metal, transition metal, or the like. In some embodiments, the contacts 972 are formed of tungsten, although other materials, such as Cu, Al, AlCu, TiN, TiW, Ti, TaN, Ta, Pt, or any combination thereof, could alternatively be utilized. In an embodiment in which the contacts 972 are formed of tungsten, the contacts 972 may be deposited by CVD techniques known in the art, although any method of formation could alternatively be used.

Figure 10:
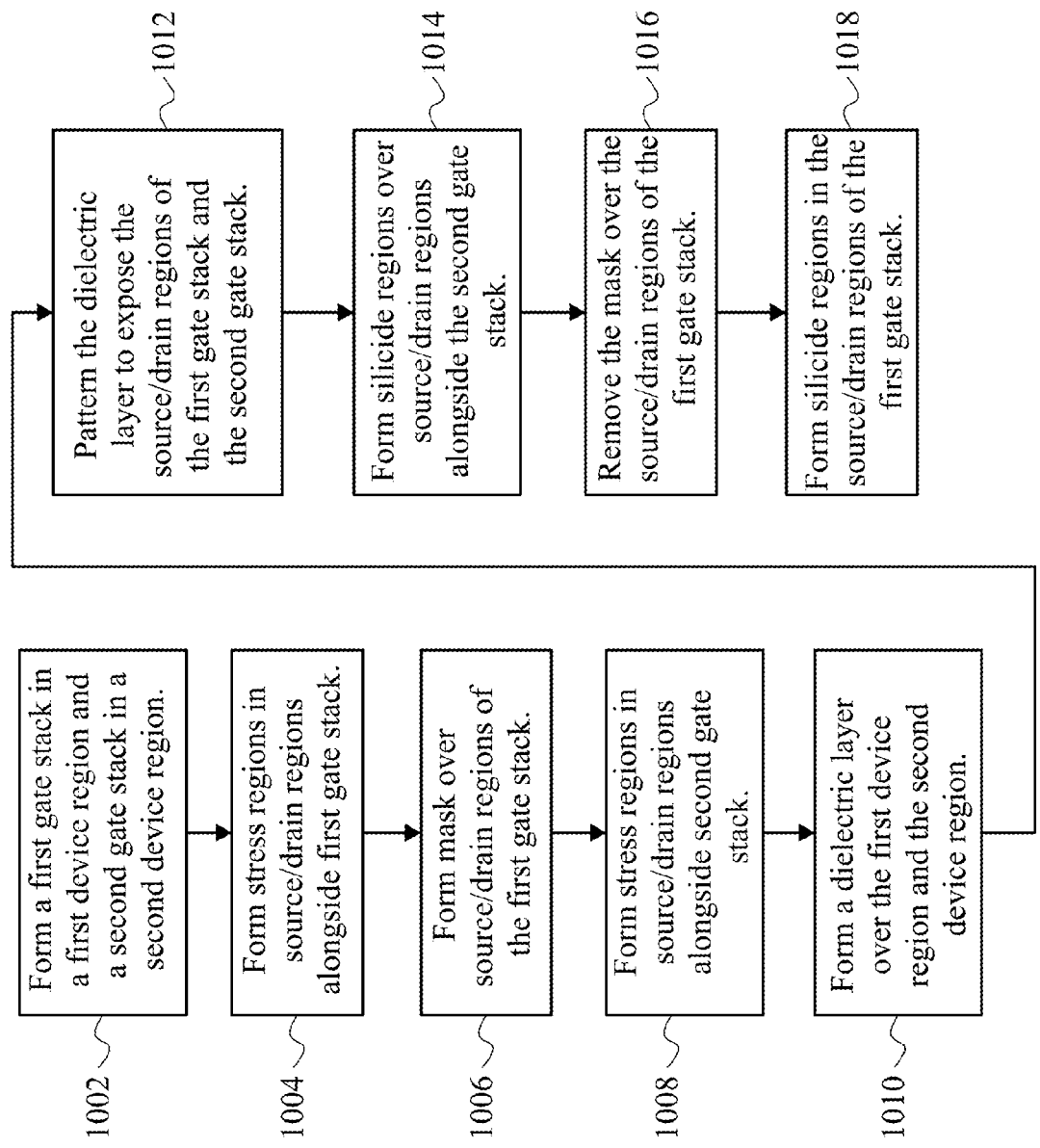
FIG. 10 is a flow chart illustrating a method of forming a semiconductor device, in accordance with some embodiments.

FIG. 10 is a flowchart illustrating a method of forming a semiconductor device. The method begins in step 1002, wherein a first gate stack is formed in a first device region and a second gate stack is formed in a second device region, such as, for example, discussed above with reference to FIG. 1. In step 1004, stress regions are formed alongside the first gate stack in the first device region, such as, for example, discussed above with reference to FIG. 1. Next, in step 1006, a mask is formed over the source/drain regions of the first gate stack. In some embodiments, the mask is formed by oxidizing a surface of the stress regions, such as, for example, discussed above with reference to FIG. 3. In step 1008, stress regions are formed in the second device region alongside the second gate stack, such as, for example, discussed above with reference to FIGS. 4-6. A dielectric layer, such as an ILD layer, is formed over the first device region and the second device region and is patterned to expose the source/drain regions alongside the first gate stack and the second gate stack, such as, for example, discussed above with reference to FIG. 7, in steps 1010 and 1012. Next, in step 1014, silicide regions are formed in the source/drain regions of the second gate stack while the mask protects the source/drain regions alongside the first gate stack, such as, for example, discussed above with reference to FIG. 8. In step 1016, the mask over the source/drain regions alongside the first gate stack is removed, and in step 1018, silicide regions are formed in the source/drain regions alongside the first gate stack, such as, for example, discussed above with reference to FIG. 9

Embodiments such as those discussed above provide low N/P contact resistance (Rcsd). The silicide material may be optimized by Schottky barrier height engineering individually for the n-type devices and the p-type devices without the use of additional masks. For example, metal-rich titanium silicide (TiSix) and nickel mono-silicide (NiSi) are widely used for N/P source/drain (S/D) contact material with low Schottky barrier height (SBH), respectively.

In some embodiments, a method of forming a semiconductor device is provided. The method includes providing a substrate having a first device region and a second device region. A first gate stack in the first device region and a second gate stack in the second device region is formed, wherein first source/drain regions are on opposing sides of the first gate stack and second source/drain regions are on opposing sides of the second gate stack. A mask layer is formed along a surface of the first source/drain regions, and a patterned dielectric layer is formed over the first device region and the second device region, the first source/drain regions and the second source/drain regions being exposed through the patterned dielectric layer. A second silicide layer is formed over the second source/drain regions. The mask layer is removed and a first silicide layer is formed over the first source/drain regions.

In other embodiments, another method of forming a semiconductor device is provided. The method includes providing a substrate, the substrate having a first device region and a second device region, the first device region having a first gate stack, the second device region having a second gate stack, first source/drain regions being on opposing sides of the first gate stack, second source/drain regions being on opposing sides of the second gate stack. First stress regions are formed in the first source/drain regions, and first oxidized regions are formed in the first source/drain regions. Second stress regions in the second source/drain regions. A first dielectric layer is formed over the first device region and the second device region, and the first dielectric layer is patterned to expose the first oxidized regions and the second stress regions. A second silicide regions over the second stress regions. After forming the second silicide regions, the first oxidized regions are removed, and first silicide regions are formed over the first stress regions.

In yet other embodiments, another method of forming a semiconductor device is provided. The method includes providing a substrate, the substrate having a first device region and a second device region. A first gate stack is formed in the first device region and a second gate stack is formed in the second device region, first source/drain regions being on opposing sides of the first gate stack, second source/drain regions being on opposing sides of the second gate stack. A first mask layer is formed over the second device region, and first stress regions are formed in the first source/drain regions. A surface of the first stress regions is oxidized while the first mask layer protects the second source/drain regions, thereby forming first oxidized regions. A portion of the first mask layer over the second source/drain regions is removed, and second stress regions in the second source/drain regions are formed. An ILD is formed over the first device region and the second device region, the ILD being patterned to expose the first oxidized regions and the second stress regions. A second silicide region in the second source/drain regions is formed. At least a portion of the first oxidized regions is removed, and a first silicide region in the first source/drain regions are formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first gate stack in a first device region of a substrate and a second gate stack in a second device region of the substrate, first source/drain regions being on opposing sides of the first gate stack, second source/drain regions being on opposing sides of the second gate stack;
    oxidizing the first source/drain regions, thereby forming a mask layer along a surface of the first source/drain regions;
    forming a patterned dielectric layer over the first device region and the second device region, the first source/drain regions and the second source/drain regions being exposed through the patterned dielectric layer;
    forming a second silicide layer over the second source/drain regions;
    removing the mask layer; and
    forming a first silicide layer over the first source/drain regions.

2. The method of claim 1, the forming the mask layer comprises:
    forming one or more first masking layers over the first device region and the second device region; and
    patterning the first masking layers in the first device region to form first spacers alongside the first gate stack.

3. The method of claim 1, wherein the oxidizing comprises implanting oxygen.

4. The method of claim 1, wherein the first gate stack and the second gate stack are dummy gate stacks.

5. The method of claim 1, further comprising removing the first gate stack and the second gate stack and forming a first metal gate stack and a second metal gate stack.

6. The method of claim 1, further comprising forming first stress regions in the first source/drain regions.

7. The method of claim 6, further comprising forming second stress regions in the second source/drain regions.

8. A method of forming a semiconductor device, the method comprising:
    providing a substrate, the substrate having a first device region and a second device region, the first device region having a first gate stack, the second device region having a second gate stack, first source/drain regions being on opposing sides of the first gate stack, second source/drain regions being on opposing sides of the second gate stack;
    forming first stress regions in the first source/drain regions;
    forming first oxidized regions in the first source/drain regions;

forming second stress regions in the second source/drain regions;
forming a first dielectric layer over the first device region and the second device region;
patterning the first dielectric layer to expose the first oxidized regions and the second stress regions;
forming second silicide regions over the second stress regions;
after forming the second silicide regions, removing the first oxidized regions; and
forming first silicide regions over the first stress regions.

9. The method of claim 8, further comprising forming one or more layers over the second device region prior to the forming the first oxidized regions.

10. The method of claim 9, further comprising, after the forming the first oxidized regions, patterning the one or more layers over the second device region to form first spacers alongside the second gate stack.

11. The method of claim 10, further comprising:
forming an additional dielectric layer over the first device region and the second device region; and
patterning the additional dielectric layer over the second device region to form additional spacers alongside the second gate stack;
wherein the additional dielectric layer protects the first oxidized regions during the forming the second stress regions.

12. The method of claim 8, wherein the removing the first oxidized regions comprises a SiCoNi clean process.

13. The method of claim 8, wherein the forming the first oxidized regions comprises implanting oxygen.

14. A method of forming a semiconductor device, the method comprising:
forming a first gate stack in a first device region of a substrate and a second gate stack in a second device region of the substrate, first source/drain regions being on opposing sides of the first gate stack, second source/drain regions being on opposing sides of the second gate stack;
forming a first mask layer over the second device region;
forming first stress regions in the first source/drain regions;
oxidizing a surface of the first stress regions while the first mask layer protects the second source/drain regions, thereby forming first oxidized regions;
removing a portion of the first mask layer over the second source/drain regions;
forming second stress regions in the second source/drain regions;
forming an interlayer dielectric (ILD) over the first device region and the second device region, the ILD being patterned to expose the first oxidized regions and the second stress regions;
forming a second silicide region in the second source/drain regions;
removing at least a portion of the first oxidized regions; and
forming a first silicide region in the first source/drain regions.

15. The method of claim 14, wherein the first mask layer comprises a plurality of layers.

16. The method of claim 14, further comprising, after the oxidizing, patterning the first mask layer over the second device region to form first spacers alongside the second gate stack.

17. The method of claim 16, further comprising:
forming an additional dielectric layer over the first device region and the second device region; and
patterning the additional dielectric layer over the second device region to form additional spacers alongside the second gate stack;
wherein the additional dielectric layer protects the first oxidized regions during the forming the second stress regions and the second silicide regions.

18. The method of claim 14, wherein the removing at least a portion of the first oxidized regions comprises a SiCoNi clean process.

19. The method of claim 14, wherein the forming the first oxidized regions comprises implanting oxygen.

20. The method of claim 14, further comprising replacing the first gate stack and the second gate stack with metal gate stacks.

* * * * *